United States Patent [19]

Snakenborg

[11] Patent Number: 4,946,763

[45] Date of Patent: Aug. 7, 1990

[54] METHOD FOR PROVIDING A DESIGN PATTERN ON A METAL STENCIL AND METAL STENCIL HAVING A PATTERNABLE COVERING LAYER

[75] Inventor: Johannes T. Snakenborg, Dieren, Netherlands

[73] Assignee: Stork Screens B.V., Boxmeer, Netherlands

[21] Appl. No.: 193,740

[22] Filed: May 13, 1988

[30] Foreign Application Priority Data

May 15, 1987 [NL] Netherlands ........................ 8701176

[51] Int. Cl.[5] ................................................ G03F 7/12

[52] U.S. Cl. .................................... 430/308; 430/311; 430/945; 101/178.4; 250/318

[58] Field of Search ............... 430/275, 279, 308, 291, 430/311, 945; 101/128.4; 250/318

[56] References Cited

U.S. PATENT DOCUMENTS

| | | | |
|---|---|---|---|
| 2,500,617 | 3/1950 | Meigs . | |
| 3,226,256 | 12/1965 | Schneble, Jr. et al. | 427/98 |
| 3,696,742 | 10/1972 | Parts et al. . | |
| 3,981,237 | 9/1976 | Rhodes . | |
| 4,411,980 | 10/1983 | Henry et al. | 430/291 |
| 4,670,351 | 6/1987 | Keane et al. | 430/319 |

FOREIGN PATENT DOCUMENTS

| | | | |
|---|---|---|---|
| 0094142 | 11/1983 | European Pat. Off. . | |
| 5543838 | 7/1978 | Japan | 430/291 |
| 57-128550 | 10/1982 | Japan . | |
| 58-8695 | 1/1983 | Japan . | |
| 60-107342 | 6/1985 | Japan . | |
| 7210078 | 1/1973 | Netherlands . | |
| 1357988 | 6/1974 | United Kingdom . | |
| 2162015 | 1/1986 | United Kingdom . | |

*Primary Examiner*—Paul R. Michl
*Assistant Examiner*—Christopher D. RoDee
*Attorney, Agent, or Firm*—Birch, Stewart, Kolasch & Birch

[57] ABSTRACT

The present invention relates to a method for forming a pattern in a metal stencil or screen which is covered by a covering layer in the form of a resist material. The pattern is formed by locally removing the lacquer or resist from the screen's perforations with the use of a beam of high energy radiation such as a laser beam. The resist material used is filled to a high concentration with metal powder to increase its thermal conductivity. The present invention also relates to a metal stencil provided with such a metal-filled covering layer which is patternable with the use of a radiation beam.

5 Claims, 1 Drawing Sheet

METHOD FOR PROVIDING A DESIGN PATTERN ON A METAL STENCIL AND METAL STENCIL HAVING A PATTERNABLE COVERING LAYER

BACKGROUND OF THE INVENTION

The present invention relates to a method for providing a design pattern on a metal stencil for screen printing which is provided with a patternable covering layer, by locally subjecting the patternable covering layer, in accordance with a predetermined pattern, to the influence of high energy radiation in beam form, as a result of which parts of the covering layer are removed.

It is known from Patent Specification No. 241567 from the German Democratic Republic to provide a pattern in a covering layer which is present on the surface of a stencil for screen printing, the pattern being formed by programmed control of a laser beam in a manner such that a pattern, permeable to a printing medium, is formed in the resist layer in accordance with a predetermined pattern.

It is possible with such a known method to provide a pattern in a resist layer which is present on a stencil for screen printing, in a reproducible manner. The method has, however, the disadvantage in that the edge sharpness of the patterns formed in this manner leaves something to be desired. It is generally noticed, specifically at the places at which the patterned resist layer spans a perforation in the stencil and where part of the resist has to be removed in the perforation, while the remaining part has to be retained, that the entire resist layer is removed from the perforation. The consequence of said complete removal is that, on printing with such stencils, a considerable degree of loss of definition is noticed at the edge of patterns as a result of a serration effect which is very disadvantageous, especially when forming patterns of very fine detail, for the end result of the printing process.

SUMMARY OF THE INVENTION

The applicant has now surprisingly found that a solution can be provided for the problems referred to if it is ensured that the patternable covering layer is formed from a resist material extended with metal powder.

Specifically, it has been found that the above-mentioned complete removal of the resist layer from a perforation in the stencil, instead of a partial removal thereof is a consequence of a lack of thermal conductivity of the resist layer in question. The very high energy content of high-energy radiation in beam form results in a locally induced combustion and/or conversion of the resist layer not remaining restricted to the target place of the beam but in said effect extending to the place where the resist layer is supported by a metal of high conductivity. By, then, considerably increasing the thermal conductivity of the resist layer by introduction of metal powder the result is achieved that surplus energy is more easily carried off to the mass of the metal stencil lying underneath, so that a combustion or conversion phenomenon remains limited to the target point of the radiation beam. In the present application, removal of a resist is understood to mean the direct removal, for example, by combustion and evaporation, respectively of the material of the resist layer.

Any material residues which may still be present can in addition be removed by mechanical or pneumatic means.

In particular the resist material used in the method according to the invention is one or more components comprising resist material which is cured before or after the treatment with high energy radiation.

As a source of high energy radiation mostly a laser will be used; however also E-beams, and for instance ion-beams may be formed and used.

Curing can take place by application of a separate heat treatment; the composition can also be chosen such that curing takes place as a result of the heat dissipated by the radiation beam, which heat spreads through the patternable covering layer due to the high conductivity of the resist used.

An advantageous form of a method for providing a design pattern is constructed as described in the characterizing part of claim 3.

In certain occasions, for instance when printing very long runs and/or printing with very abrasive or agressive printing pastes, it may be very beneficial to cover the pattern obtained after the patterning operation with a metal. Expediently such a metal covering is applied in an electroplating operation. For that reason with advantage the filling percentage of the resist material used is high, for instance at least 55% based on the total weight of lacquer and metal.

If the metal filling percentage is too low of course the surface of the resist may be rendered electrically conductive by electroless plating with Ni or Cu.

After such first treatment electrodeposition may be used for the remaining thickness.

The covering layer material is rendered electroplatable with a sufficient degree of extension with a metal powder, and as a result the mechanical resistance and corrosion resistance of such a covering layer can be very considerably increased and furthermore can be optimally chosen for given applications.

If, in the method according to the invention plating of the resist surface is desired, said surface is subjected to a pretreatment such as a degreasing or generally an activation step.

The metal powder in the covering layer can comprise, for example, zinc, copper, nickel, iron or alloys of one or more of these metals.

The present invention also relates to a metal stencil for screen printing which is covered with a patternable covering layer in which a predetermined pattern may be formed by subjecting said covering layer in a controlled way to the influence of high energy radiation in beam form which, according the present invention is characterized in that the patternable covering layer is constituted by a resist material which is extended with metal powder.

The metal stencil itself expediently is a screen which is obtained by electrodeposition of metal onto a filled matrix, i.e. a meal plate or mandrel having recesses which are filled with an insulating material. Upon depositing metal, a screen material is formed having openings at the site corresponding to the filled recesses. The deposited metal for the screen very often will be nickel. Other metals such as iron, copper or alloys of metals may also be chosen.

The composition of the resist used is indicated in claims 7 and 8. In order to obtain the best results the filling percentage of the resist material with metal powder is chosen such that at least the thermal conductivity of the filled resist is as close as possible to the thermal conductivity of the metal used for the metal stencil. In most cases at least a filling percentage of 25% will be used, based on the total weight.

Filling percentages of at least about 55% are to be preferred if, in addition to high thermal conductivity, electroplatability of the resist is also to be provided.

There are no particular restrictions with respect to the resist to be used. Any type of resist that can be applied in a thin, uniform layer on the surface of a stencil and that is capable of taking up a sufficient quantity of metal powder and keeping it suspended during application, is suitable. For example, alkyd resin types filled with microfine zinc powder have been found to be very suitable, whereas epoxy resins also appear to be extremely useful.

Application of the resist onto the stencil material may be carried out in various ways known to the skilled worker. Often a squegee is used; however spraying or dipping offer also good possibilities. After coating if necessary a drying and/or curing operation is carried out.

The resins used may, as said, be of a one or more component type.

A one component type is also a resin such as an isocyanate-type lacquer which may cure under action of moisture from the environment.

BRIEF DESCRIPTION OF THE DRAWINGS

The invention will now be illustrated with the aid of the accompanying drawing, in which:

FIG. 1 shows diagrammatically a material 1 for a stencil for screen printing, having bridges 2 covered by a covering layer 3 and an area 4 from which the resist 3 is removed. In area 4, the resist is completely removed from the bridges 7 and from opening 6, while part of the resist 3 is left behind in the opening 5. This result is achieved by using a radiation beam, for example a laser beam having a diameter which in this case was considerably smaller than the section of the opening present in the material for the stencil for screen printing.

The screen, used in this case, may be a nickel screen, having a fineness between 80 and 500 mesh or higher (80–500 lines per inch=25,4 mm); the thickness may be from 75 to 200 μm. The screen may be cylindrical and seamless or flat.

Figure 1:
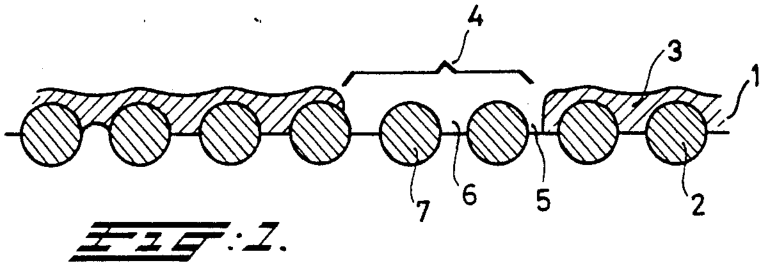
FIG. 1 shows a cross-section through a metal stencil for screen printing, provided with a pattern.
Figure 2:
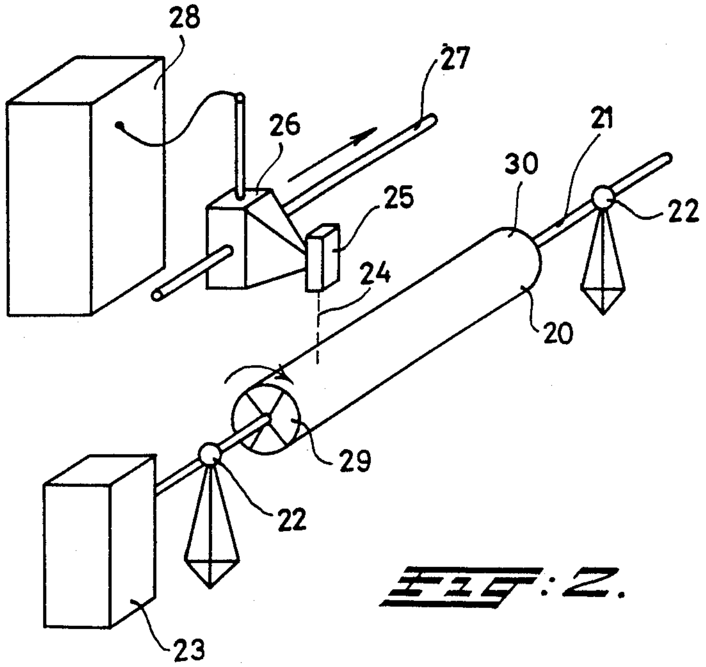
FIG. 2 shows a device for carrying out a method of forming a pattern in a patternable covering.

FIG. 2 shows diagrammatically an arrangement for providing a cylindrical stencil for screen printing with a pattern. The stencil for screen printing 20 is clamped with the aid of means 29 and 30 and fixed on a shaft 21 which can rotate in bearings 22 by means of drive 23. A laser 25 directs a laser beam 24 on the surface of the rotating stencil. For describing a spiral path, the holder 26 moved at even speed along axis 27, the beam energization information required being provided by a diagrammatically shown control unit 28 connected to the head 26.

It has been found on use of the method of the present invention that it is achieved by using covering layer materials in which a high metal powder content is present, that a very accurate definition of the formed pattern can be realized. In particular, given a suitable small diameter of the radiation beam, the covering layer is removed from only part of an opening in the stencil material without affecting, to any appreciable degree, the resist part to be retained in the said opening and without noticeable reduction of the resistance of such a resist layer part. These good results are achieved, in particular, when, according to the present invention, the thermal conductivity of the metal powder-extended resist layer essentially corresponds to the thermal conductivity of the metal stencil for screen printing used.

What is claimed is:

1. A method for providing a design pattern on a metal stencil for screen printing which is provided with a patternable covering layer, by a process in which the patternable covering layer, in accordance with a predetermined pattern, is locally subjected to the influence of high energy radiation in beam form, as a result of which, parts of the covering layer are removed, wherein a resist material, extended with a metal powder, is used as the material for forming the patternable covering layer and said material is removed from the zone of impact between said beam and said covering layer.

2. The method according to claim 1, wherein the resist material comprises one or more materials which are cured before or after the treatment with high energy radiation.

3. The method according to claim 1, wherein the metal powder content in the resist material is chosen such that a metal layer can be electrolytically deposited on the patternable covering layer in an electroplating bath.

4. The method according to claim 3, wherein the patternable covering layer comprising the resist material filled with a metal powder, is subjected before electroplating to a pretreatment such as degreasing, and activation.

5. The method according to claim 1, wherein the patternable covering layer is formed with the use of a resist material which is extended with a metal powder selected from the group consisting of zinc, copper, nickel and iron and alloys of one or more of these metals.

* * * * *